US008515499B1

(12) United States Patent
Stekkelpak et al.

(10) Patent No.: US 8,515,499 B1
(45) Date of Patent: *Aug. 20, 2013

(54) ESTIMATING REMAINING USE TIME OF MOBILE COMPUTING DEVICES

(71) Applicant: Google Inc., Mountain View, CA (US)

(72) Inventors: Zoltan Stekkelpak, Sunnyvale, CA (US); Gyula Simonyi, Dublin (IE)

(73) Assignee: Google Inc., Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/622,617

(22) Filed: Sep. 19, 2012

Related U.S. Application Data

(60) Provisional application No. 61/699,031, filed on Sep. 10, 2012.

(51) Int. Cl.
*H04B 1/38* (2006.01)
(52) U.S. Cl.
USPC ........ 455/566; 455/419; 455/574; 455/115.1; 455/343.5; 455/117
(58) Field of Classification Search
USPC .................. 455/566, 419, 574, 115.1, 343.5, 455/102, 117
See application file for complete search history.

(56) References Cited

U.S. PATENT DOCUMENTS

| 2001/0011032 A1* | 8/2001 | Suzuki .......................... 455/574 |
| 2003/0119460 A1* | 6/2003 | Zipper .......................... 455/115 |
| 2008/0268828 A1* | 10/2008 | Nagaraja ....................... 455/419 |
| 2009/0251326 A1* | 10/2009 | Kim et al. ................... 340/636.1 |
| 2010/0141777 A1* | 6/2010 | Jin et al. ........................ 348/189 |
| 2011/0040996 A1* | 2/2011 | Hackborn et al. ............ 713/340 |

* cited by examiner

*Primary Examiner* — Kamran Afshar
*Assistant Examiner* — Shahriar Behnamian
(74) *Attorney, Agent, or Firm* — Fish & Richardson P.C.

(57) ABSTRACT

Methods, systems, apparatus, and computer programs encoded on computer storage medium, for receiving a set of expected activities, each expected activity in the set of expected activities including an activity that is expected to be performed by a computing device, determining one or more time periods based on the set of expected activities, determining one or more expected rates of change of state of charge (SOC) of a battery of the mobile computing device by, for each time period of the one or more time periods, determining an expected rate of change of SOC based on a base rate of change of SOC and one or more expected activities associated with the time period, and determining an estimated remaining time based on the one or more expected rates of change of SOC, the remaining time corresponding to a time at which an expected SOC is less than a threshold SOC.

30 Claims, 5 Drawing Sheets

ESTIMATING REMAINING USE TIME OF MOBILE COMPUTING DEVICES

CROSS-REFERENCE TO RELATED APPLICATIONS

This application claims the benefit of U.S. Provisional Patent Application No. 61/699,031, filed Sep. 10, 2012, the entire contents of the previous application is hereby incorporated by reference.

BACKGROUND

Mobile computing continues to grow quickly as mobile computing devices, such as smart phones, add more power and more features. Users of such devices may now access various services on the Internet, such as mapping applications, electronic mail, text messaging, various telephone services, general web browsing, music and video viewing, and similar such services.

Mobile computing devices generally include a battery, which provides power when the mobile computing device is not directly connected to a power source. Advances in battery technology have extended the battery life. However, the increased demands on the mobile computing device have correspondingly increased the power demand from the battery.

SUMMARY

This disclosure relates to power management in mobile computing devices, and more particularly to estimating the remaining use time of a mobile computing device based on expected activities of the mobile computing device.

In general, innovative aspects of the subject matter described in this disclosure may be embodied in methods, executed using one or more processors, that include the actions of receiving a set of expected activities, each expected activity in the set of expected activities comprising an activity that is expected to be performed by a mobile computing device, determining, by the one or more processors, one or more time periods based on the set of expected activities, determining, by the one or more processors, one or more expected rates of change of state of charge (SOC) of a battery of the mobile computing device by, for each time period of the one or more time periods, determining an expected rate of change of SOC based on a base rate of change of SOC and one or more expected activities associated with the time period, and determining, by the one or more processors, an estimated remaining time based on the one or more expected rates of change of SOC, the remaining time corresponding to a time at which an expected SOC is less than a threshold SOC.

Other implementations of this aspect include corresponding systems, apparatus, and computer programs, configured to perform the actions of the methods, encoded on computer storage devices.

These and other implementations may each optionally include one or more of the following features. For instance, providing a notification based on the estimated remaining time. The notification notifies a user of the mobile computing device that a battery of the mobile computing device should be charged. Identifying one or more expected events, for each expected event, determining an event time period, the event time period indicating an expected duration of a respective expected event, and determining that the time at which the expected SOC is less than the threshold SOC occurs during one or more event time periods, wherein providing the notification occurs in response to determining that the time at which the expected SOC is less than the threshold SOC occurs during one or more event time periods. Each of the expected activities is identified based on one or more of a usage pattern associated with a user of the mobile computing device and a calendar of the user. Each activity of the one or more activities is associated with a respective multiplier, and an expected rate of change of SOC associated with an activity is determined based on the multiplier associated with the activity and the base rate of change of SOC. Each expected activity in the set of expected activities is associated with a respective probability. The one or more expected rates of change of SOC are determined based on the probabilities. Each respective probability exceeds a threshold probability. Providing the remaining time to a user of the mobile computing device. Providing the remaining time includes at least one of displaying the remaining time on a display of the mobile computing device and audibly providing the remaining time using a speaker of the mobile computing device. Each time period is defined based on a unique set of expected activities relative to an immediately previous time period and an immediately subsequent time period. Determining a current SOC of a battery of a mobile computing device, wherein determining one or more expected rates of change of SOC is based on the current SOC.

Implementations of the present disclosure provide one or more of the following example advantages. The displayed power level (e.g., the percentage remaining of the battery, or time indication of remaining time of the battery) is more indicative from the device's near term usage's point of view to give an accurate representation of charging needs. Improving the user's experience with the device by notifying the user of potential future predicted times when the battery will need to charged.

The details of one or more implementations of the subject matter described in this specification are set forth in the accompanying drawings and the description below. Other potential features, aspects, and advantages of the subject matter will become apparent from the description, the drawings, and the claims.

BRIEF DESCRIPTION OF THE DRAWINGS

Like reference numbers represent corresponding parts throughout.

DETAILED DESCRIPTION

Figure 1:
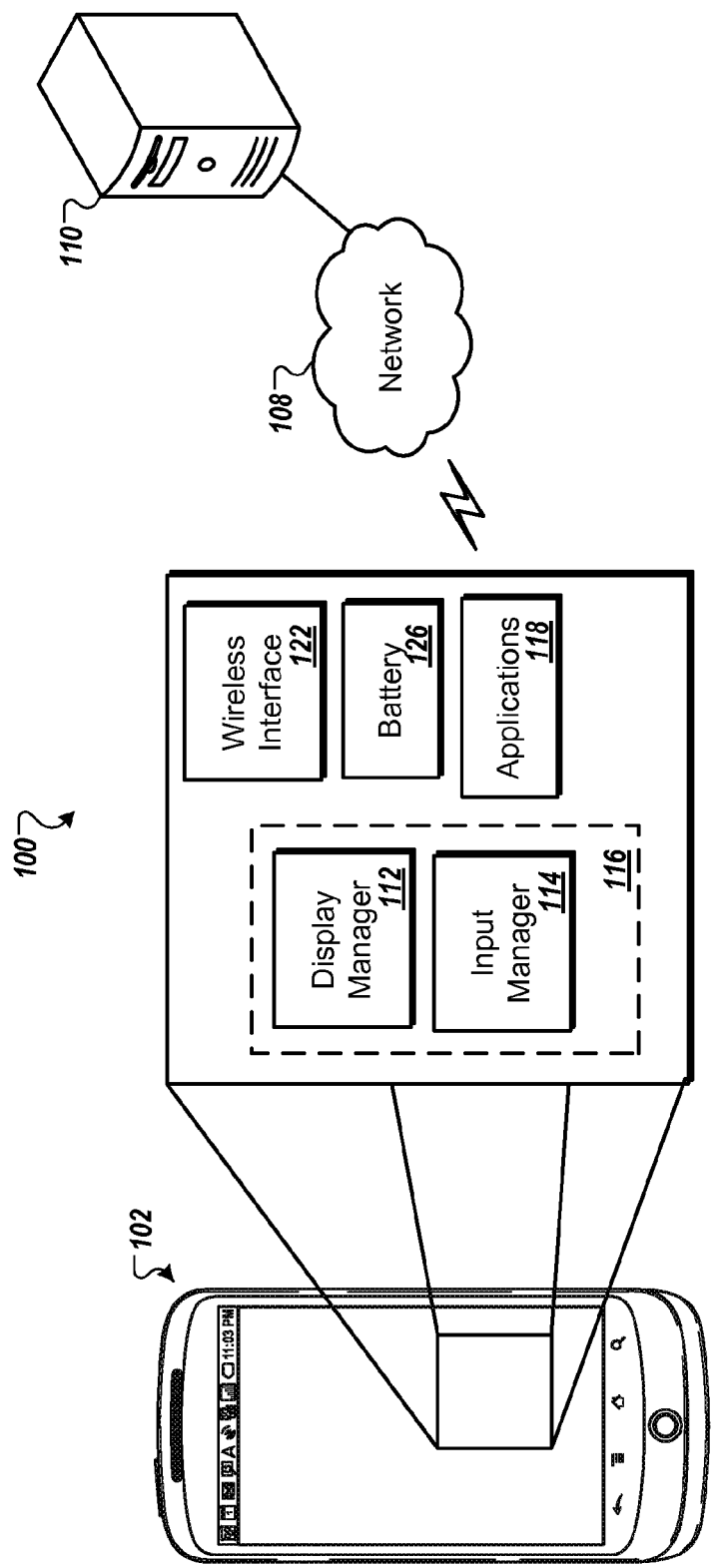
FIG. 1 depicts an example system for estimating remaining use time of a mobile computing device in accordance with implementations of the present disclosure.

Implementations of the present disclosure are directed to estimating the remaining usage time of a mobile computing device based on expected (predicted) activities of the mobile computing device. In some implementations, the state of charge (SOC) of a battery of a mobile computing device and the rate of change of the SOC are predictively determined. In some examples, future SOCs and rates of change of SOC are estimated. By predicting rates of change of the SOC and SOCs, an indication of how much longer the battery will continue to perform can be estimated. In some examples, the rates of change of the SOC can be determined based on expected activities to be performed by the mobile computing device. In some examples, the SOCs can be determined based on the predicted rates of change of the SOC. In some examples, if the SOC falls below a threshold level, the battery is no longer able to sufficiently power the mobile computing device. Consequently, predicted SOCs can be compared to a threshold to determine when the SOC will be insufficient to power the mobile computing device. In some examples, a predicted usage time remaining can be displayed to a user of the mobile computing device.

As discussed in further detail herein, activities can be actual activities or expected (predicted) activities. In some examples, a current activity can include an activity that is actually being performed by the mobile computing device. In some examples, an expected activity can include an activity that the mobile computing device is expected to perform sometime in the future. In some examples, expected activities can be predicted based on, among other things, a calendar of the user, historical interactions of the user with the mobile computing device and/or information provided by one or more other sources. For any given time period, the rate of change of the SOC can be based on the expected activities within the respective time period. That is, the expected activities for a future time period can be used to determine a predicted SOC and/or rate of change of SOC for that time period. The predicted SOC and/or the predicted rate of change of SOC can be used to identify a predicted time at which the SOC may be below the threshold.

In some implementations, intelligent alerts (notifications) can be provided based on predicted SOCs of the mobile computing device. In some examples, one or more events can be provided, each event affecting the SOC, as discussed in further detail below. In response to planned or expected occurrences of one or more events and one or more predicted SOCs, a notification can be provided. In some examples, the notification is provide prior to the planned occurrence of the event. In some examples, each notification instructs a user of the mobile computing device to charge the battery prior to the occurrence of the event. For example, it can be estimated that the SOC will fall below the threshold SOC at a particular time. It can also be determined that at that particular time, the user will be at a location that might be inconvenient for charging the battery (e.g., on a flight). Consequently, a notification can be provided and can advise the user to charge the battery (e.g., now or at some time before the event).

In general, the SOC of a battery indicates the amount of usable energy stored within the battery at a given time. In some examples, the SOC is provided as the available capacity of the battery expressed as a percentage of the rated capacity of the battery. The rate of change of the SOC ("dSOC/dt") will vary based on the particular energy demands at a given time. A mobile computing device, such as that described in further detail below, can perform various functions that can be referred to as activities. Example activities can include use of the mobile computing device for telephony, email, Internet, video, audio, text messaging, instant messaging and/or global positioning system (GPS). When functioning as an Internet browser, for example, the mobile computing device can be used to provide streaming video and/or audio through the Internet connection. Other example activities can include standby and OFF. When operating in standby, the mobile computing device is powered ON, but is not being actively operated by a user.

FIG. 1 depicts an example system 100 for estimating remaining use time of a mobile computing device in accordance with implementations of the present disclosure. In general, the system 100 includes a mobile computing device 102 (e.g., a smart phone) with a touchscreen display 104, where the touchscreen display 104 can be used as a user interface for the mobile computing device 102. A number of components within the mobile computing device 102 provide for interaction with the mobile computing device 102. For purposes of clarity, FIG. 1 shows certain example components of the mobile computing device 102.

In some implementations, the mobile computing device 102 can communicate with a server 110 through a network 108 using a wireless interface 122. The network 108 can be the Internet or a cellular network. For example, the mobile computing device 102 can direct telephone calls through a telephone network or through a data network using voice over internet protocol (VOIP). In addition, the mobile computing device 102 can transmit other forms of data over the Internet, for example, data in the form of Hypertext Transfer Protocol (HTTP) requests that are directed at particular web sites. The mobile computing device 102 may receive responses, for example, in forms that can include but are not limited to mark-up code for generating web pages, media files, and electronic messages.

A number of components running on one or more processors included in the mobile computing device 102 enable a user to interact with the touchscreen display 104 to provide input and to receive visual output. For example, an interface manager 116 can manage interaction with the touchscreen display 104, and includes a display manager 112 and an input manager 114.

The display manager 112 can manage the information displayed to a user using the touchscreen display 104. For example, an operating system running on the mobile computing device 102 can use the display manager 112 to arbitrate access to the touchscreen display 104 for a number of applications 118 running on the mobile computing device 102. For example, the mobile computing device 102 can display a number of applications, each in its own window on the touchscreen display 104, and the display manager 112 can control what portions of each application are shown on the touchscreen display 104.

The input manager 114 can control the handling of data received from a user using the touchscreen display 104 or other input mechanisms. For example, the input manager 114 can coordinate with the display manager 112 to identify where, on the touchscreen display 104, a user is entering information so that that the mobile computing device 102 may understand the context of the input. In addition, the input manager 114 may determine which application or applications should be provided with the input. For example, input to the mobile computing device 102 using the touchscreen display 104 can be a user placing their finger on the touchscreen display while manipulating the mobile computing device 102. The area of the mobile computing device 102 touched by the user's finger can determine which of the applications 118 the mobile computing device 102 launches and runs.

A battery 126 can provide power (e.g., electrical energy) to the mobile computing device 102. The battery can provide the power directly (e.g., via electrochemical cells) or indirectly (e.g., provide access to power). The battery 126 is associated with a SOC. The SOC of the battery 126 indicates the amount of usable energy stored within the battery 126 at a given time. In some examples, the SOC is the available capacity of the battery 126 expressed as a percentage of its rated capacity.

Figure 2:
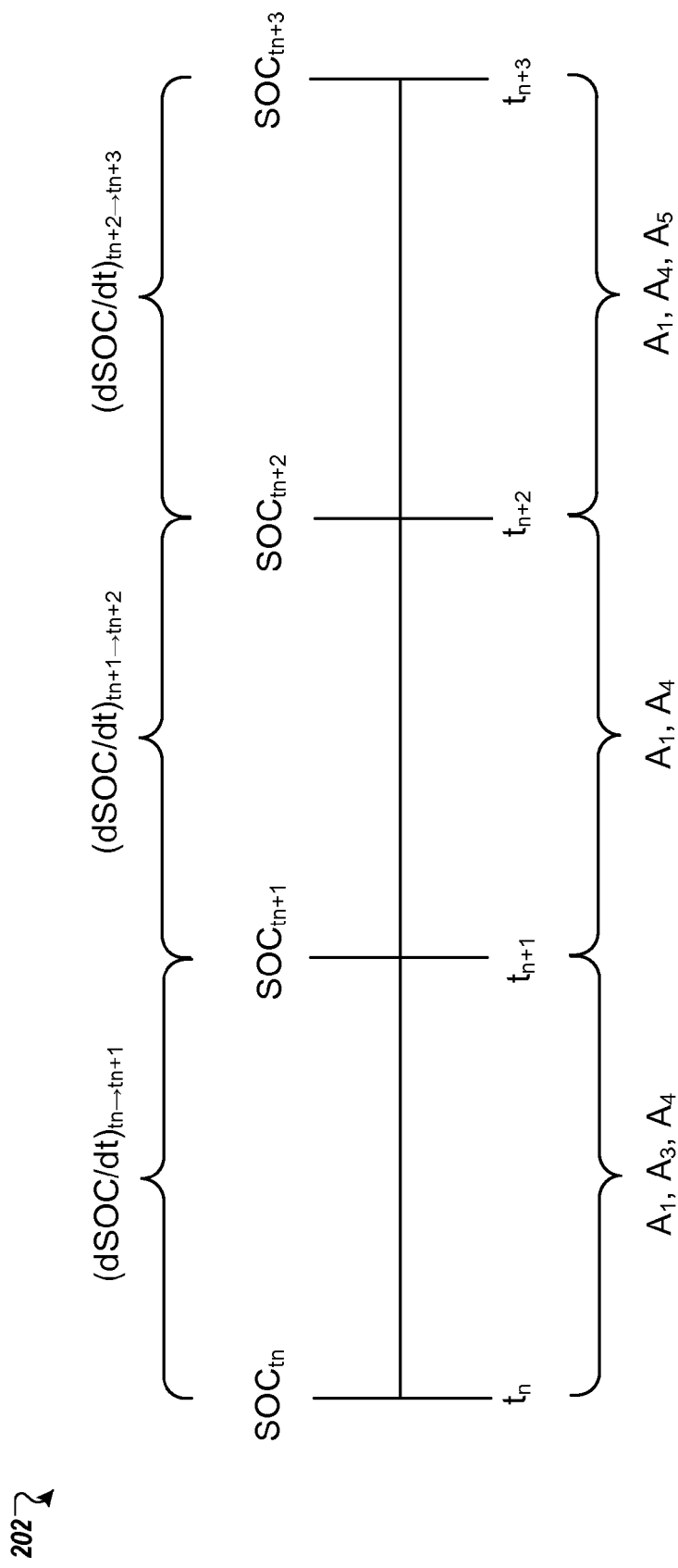
FIG. 2 depicts an example timeline.

FIG. 2 depicts an example timeline 202. More particularly, the timeline 202 depicts a current SOC (e.g., at time $t_n$) and predicted SOCs (e.g., at respective times after $t_n$). The timeline 202 also depicts predicted rates of change of the SOC over time with respect to differing activities, detailed further below. The rate of change of the SOC of the battery 126 (the rate of discharge of the battery 126) can be represented as dSOC/dt or ΔSOC/Δt (for simplicity of description, hereinafter dSOC/dt). In the depicted example, and as discussed in further detail herein, a predicted dSOC/dt can be provided for each time period of a plurality of time periods (e.g., a time period $T_{tn \to tn+1}$ that occurs from $t_n$ to a subsequent time $t_{n+1}$).

The mobile computing device can have an associated base rate of discharge, $(dSOC/dt)_{BASE}$. In some examples, the base rate of discharge is provided as minimum expected rate of discharge of the battery when the mobile computing device is minimally operable (e.g., when the mobile computing device is in a standby state or a sleep state). In some examples, the base rate of discharge reflects a powered state (e.g., "ON" power state) of the mobile computing device (e.g., have the processor powered). In some examples, the base rate of discharge can be based on a type of mobile computing device, a particular operating system (and/or version of the operating system) employed by the mobile computing device, type of mobile carrier, a type of battery employed, an age of the battery and/or other features that can influence the base rate of discharge of the battery.

The rate of discharge of the battery (dSOC/dt) over a given time period can be based on activities $A_1, A_2, \ldots, A_p$ that can be performed by the mobile computing device during the given time period. In some examples, the activities can include connection to a carrier signal, roaming of the carrier signal, type of carrier signal (e.g., 3G v. 4G), strength of the carrier signal, connection to a Wi-Fi network, display status (on v. off), display illumination level (e.g., full v. dim), conducting a phone call, Bluetooth connection status, video, type of video source (e.g., streaming, in-memory), among others. In some examples, multiple activities can occur concurrently. In some examples, a set of expected activities can be provided from an activity service (not shown).

In some examples, each activity can influence the rate of discharge of the battery. In some examples, each activity is associated with a respective rate of discharge (e.g., $(dSOC/dt)_{A1}, (dSOC/dt)_{A2}, \ldots, (dSOC/dt)_{Ap}$). In some examples, the activities and the associated respective rates of discharge can be based on the computing modules (e.g., the wireless interface 122, or the input manager 114 of FIG. 1) that are employed to engage such activates (i.e., the power used to employ such computing modules). For example, when the mobile computing device is connected to a carrier signal, the mobile computing device utilizes, at least, a radio transceiving module (not shown).

In some examples, to determine the rate of discharge for each of the activities $A_1, A_2, \ldots, A_p$, respective multipliers $\alpha_1, \alpha_2, \alpha_p$ can be applied to the base rate of discharge $(dSOC/dt)_{BASE}$. For example, the rate of discharge associated with a particular activity can be provided as a function of the respective multiplier activity and the base rate of discharge. In some examples, the following example relationship can be provided:

$$(dSOC/dt)_{Ai} = f(\alpha_i (dSOC/dt)_{BASE}), \text{ where } i=1, \ldots, p.$$

For example, the respective rates of discharge associated with the activities $A_1, A_2, \ldots, A_p$ can be provided in Table 1 below.

TABLE 1

Activity Rates of Discharge

| Activity | Multiplier | Rate of Discharge |
|---|---|---|
| $A_1$ | $\alpha_1$ | $(dSOC/dt)_{A1} = \alpha_1 \times (dSOC/dt)_{BASE}$ |
| $A_2$ | $\alpha_2$ | $(dSOC/dt)_{A2} = \alpha_2 \times (dSOC/dt)_{BASE}$ |
| $A_3$ | $\alpha_3$ | $(dSOC/dt)_{A3} = \alpha_3 \times (dSOC/dt)_{BASE}$ |
| $A_4$ | $\alpha_4$ | $(dSOC/dt)_{A4} = \alpha_4 \times (dSOC/dt)_{BASE}$ |
| ... | ... | ... |
| $A_P$ | $\alpha_P$ | $(dSOC/dt)_{Ap} = \alpha_p \times (dSOC/dt)_{BASE}$ |

For any time period (e.g., $T_{tn \to tn+1}, T_{tn+1 \to tn+2}, \ldots, T_{tn+x \to tn+x+1}$), one or more activities can be performed by the mobile computing device. In some implementations, for any given time period, the one or more activities are provided as expected activities. That is, activities that are expected to be performed by the mobile computing device for the time period. For example, it is identified (e.g., by the mobile computing device, or a backend server that stores user information) that the user of the mobile computing device streams an audio every weekday from 5-6 PM. Thus, it can be determined that an expected activity of the mobile computing device for the time period of 5-6 PM on every weekday includes audio streaming. To that end, by observing the habits of the user in regard to use of the mobile computing device (that is, activities performed by the mobile computing device), it can be learned over time what the expected activities of the user and/or the mobile computing device are with respect to time. In some examples, activities can be determined based on information from other sources. For example, the mobile computing device can be scheduled to automatically update one or more applications executable on the mobile computing device. As another example, a calendar application can indicate that the user has a telephone call scheduled during a particular time period.

In implementations where usage history of the mobile computing device can be used to determine expected activities, a problem can arise when the mobile computing device is new and/or the user has no available usage history. In such implementations, at least some expected activities can be determined from a baseline activity history. In some examples, the baseline activity history can be provided as an aggregate activity user that is provided based on the activity histories of a group of users. For example, user histories provided for other users using the same mobile computing device, other users within the same demographic as the user, other users with the same geo-location as the user, etc., can be utilized to generate the baseline activity history. It is appreciated that activity history for other users can be anonymized, such that the baseline activity history is generic and reflective of an average user. In some examples, the baseline activity history can be modified over time in response to actual usage of the mobile computing device by the user. In this manner, the baseline activity history morphs into a user-specific activity history over time.

In some implementations, time periods are defined based on the expected activities. For example, a time period can be defined when an activity is expected to be initiated on the mobile computing device and/or when an ongoing activity is expected to cease. In this manner, a time period can include a unique sub-set of expected activities relative to an immediately previous time period and an immediately following time period.

To that end, the expected rate of change of SOC of the battery for a time period is based on the expected activities associated with the time period. For example, for a time period $T_{tn \to tn+1}$ between a first time $t_n$ and a second, later time $t_{n+1}$, it is estimated that the expected activities include activities $A_1$, $A_3$ and $A_4$, as shown in FIG. 2. The SOC at the first time $t_n$ can be provided as $SOC_{tn}$ and as $SOC_{tn+1}$ at the second time $t_{n+1}$. In some examples, the expected rate of change of SOC between the first time $t_n$ and the second time $t_{n+1}$ is a function of the base rate of discharge, and the multipliers associated with the expected activities (e.g., $A_1$, $A_3$ and $A_4$) between the first time $t_n$ and the second time $t_{n+1}$. The rate of discharge between the first time $t_n$ and the second time $t_{n+1}$ is a function of the base rate of discharge $(dSOC/dt)_{BASE}$ and the multipliers $\alpha_1$, $\alpha_3$, and $\alpha_4$ and can be represented by the following example relationship:

$$(dSOC/dt)_{m \to m+1} = f(dSOC/dt_{BASE}, \alpha_1, \alpha_3, \alpha_4).$$

In some examples, the expected rate of discharge can be provided as a sum of the rates of discharge of each of the expected activities between the first time $t_n$ and the second time $t_{n+1}$. Continuing with the example above, the expected rate of discharge between the first time $t_n$ and the second time $t_{n+1}$ can be provided by the following example relationship:

$$(dSOC/dt)_{m \to m+1} = (dSOC/dt)_{A1} \alpha (dSOC/dt)_{A3} + (dSOC/dt)_{A4};$$

and more specifically:

$$(dSOC/dt)_{m \to m+1} = [\alpha_1 \times (dSOC/dt)_{BASE}] + [\alpha_3 \times (dSOC/dt)_{BASE}] + [\alpha_4 \times (dSOC/dt)_{BASE}];$$

or simplified:

$$(dSOC/dt)_{m \to m+1} = (\alpha_1 + \alpha_3 + \alpha_4) \times (dSOC/dt)_{BASE}.$$

Accordingly, the SOC at the time $t_{n+1}$ ($SOC_{tn+1}$) can be determined as a function of the expected rate of discharge between the first time $t_n$ and the second time $t_{n+1}$; the state of charge of the battery at the time $t_n$ ($SOC_{tn}$); and the length of time that the time period $T_{tn \to tn+1}$ (e.g., X second). Accordingly, $SOC_{tn+1}$ can be represented by the following example relationship:

$$SOC_{tn+1} = f(SOC_{tn}, (dSOC/dt)_{m \to m+1}, T_{tn \to tn+1}).$$

Specifically, the SOC of the battery at the time $t_{n+1}$ ($SOC_{tn+1}$) is a difference between the state of charge of the battery at the time $t_n$ ($SOC_{tn}$) and the amount the battery has been discharged during the time period $T_{tn \to tn+1}$. The amount the battery is expected to be discharged during the time period $T_{tn \to tn+1}$ is a function of the expected rate of discharge of the battery during the time period $T_{tn \to tn+1}$ and a difference between the first time $t_n$ and the second time $t_{n+1}$ of the time period $T_{tn \to tn+1}$. The amount the battery is expected to be discharged during the time period $T_{tn \to tn+1}$ can be represented by the following example relationship:

$$SOC_{Ttn \to tn+1} = [(dSOC/dt)_{m \to m+1}] \times [t_{n+1} - t_n].$$

Thus, the state of the charge of the battery at the time $t_{n+1}$ ($SOC_{tn+1}$) can be provided as:

$$SOC_{tn+1} = SOC_{tn} - SOC_{Ttn \to tn+1}.$$

The change in the SOC of the battery between any two times can be computed as discussed above the above. For example, the expected rate of discharge of the battery between the second time $t_{n+1}$ and a third, later time $t_{n+2}$, and for expected activities $A_1$ and $A_4$ between the second time $t_{n+1}$ and the third time $t_{n+2}$, as shown in FIG. 2, can be provided as:

$$(dSOC/dt)_{m+1 \to m+2} = (dSOC/dt)_{A1} + (dSOC/dt)_{A4};$$

and more specifically:

$$(dSOC/dt)_{m+1 \to m+2} = [\alpha_1 \times (dSOC/dt)_{BASE}] + [\alpha_4 \times (dSOC/dt)_{BASE}];$$

or simplified:

$$(dSOC/dt)_{m+1 \to m+2} = (\alpha_1 + \alpha_4) \times (dSOC/dt)_{BASE}.$$

Thus, the state of charge of the battery at the time $t_{n+2}$ ($SOC_{tn+2}$) can be provided as:

$$SOC_{tn+2} = SOC_{tn+1} - SOC_{Ttn+1 \to tn+2};$$

wherein $$SOC_{Ttn+1 \to tn+2} = [(dSOC/dt)_{m+1 \to m+2}] \times [t_{n+2} - t_{n+1}].$$

In some implementations, an expected SOC of the battery may fall below a threshold SOC ($SOC_{THR}$). In some examples, the threshold SOC can be a value of the SOC of the battery at which the mobile computing device is inoperable, operation of the mobile computing device is not optimized, and/or some undesired condition exists. To that end, based on the current SOC of the battery and the expected activities of the user, the time when the SOC of the battery falls below the threshold can be estimated. Specifically, at each time (e.g., $t_n$, $t_{n+1}$, $t_{n+2}$, ..., $t_{n+x}$), the SOC of the battery is determined ($SOC_{tn}$, $SOC_{tn+1}$, $SOC_{tn+2}$, ..., $SOC_{tn+x}$). In some examples, the time $t_n$ can be a current time and the SOC can be directly measured. That is, $SOC_{tn}$ can be provided as an actual SOC as opposed to an estimated SOC. In this manner, $SOC_{tn}$ can provide a starting point for the prediction process. The SOC at each time period is compared to the threshold SOC. When the SOC at a future time is less than the SOC threshold, it is predicted when the battery will be discharged to an undesired level.

In some implementations, an estimated usage time (time remaining) can be determined. In some examples, the time remaining can be displayed to the user. In some examples, the time remaining is determined based on the predicted time at which the SOC of the battery will be less than the threshold SOC. In some examples, the time at which the SOC is predicted to be less than the threshold SOC can be provided as $t_{DISCHARGE}$. In some examples, a difference between the current time (e.g., $t_n$) and $t_{DISCHARGE}$ can be determined and can be provided as the predicted time remaining ($t_{REMAIN}$). In some examples, $t_{REMAIN}$ can be visually and/or audibly provided to the user of the mobile computing device.

In some implementations, the activities $A_1, A_2, \ldots, A_P$ can be associated with respective probabilities $P_1, P_2, \ldots, P_P$. Each probability can be provided as the probability (likelihood) that the respective activity will occur. For example, for expected activities $A_1$, $A_3$ and $A_4$ for time period $T_{tn \to tn+1}$ between times $t_n$ and $t_{n+1}$, the probabilities associated with the activities $A_1$, $A_3$ and $A_4$ can be provided as $P_{A1}$, $P_{A3}$ and $P_{A4}$, respectively. In some examples, the probability values for each activity can vary for each time period. In some examples, the probabilities of each activity can be dependent (based on) the time periods. For example, for an expected activity (e.g., streaming video) for a first time period (e.g., 6-8 PM), a first probability (e.g., 80%) can be provided. For the same expected activity (e.g., streaming video) for second time period (e.g., 12-1 AM), a second probability (e.g., 10%) can be provided.

In some implementations, the probability of an expected activity is compared to a probability threshold ($P_{THR}$) to determine whether the expected activity is to be included within a particular time period. For example, for the time period $T_{tn \to tn+}$, the expected activities $A_1, A_2, A_3,$ and $A_4$ are each associated with probabilities $P_{A1}, P_{A2}, P_{A3}$ and $P_{A4}$. In some examples, each of the probability $P_{A1}, P_{A2}, P_{A3}$ and $P_{A4}$ is compared to the probability threshold $P_{THR}$. If a probability is less than the probability threshold $P_{THR}$, the associated activity is not included in the particular time period. For example, it can be determined that only the probabilities $P_{A1}$, $P_{A3}$ and $P_{A4}$ are greater than the probability threshold $P_{THR}$. Consequently, only the expected activities $A_1, A_3$ and $A_4$ (associated with the probabilities $P_{A1}, P_{A3}$ and $P_{A4}$) are considered in determining the expected rate of change of SOC for the time period $T_{tn \to tn+1}$ (as depicted in FIG. 2).

In some implementations, the probabilities can be used in determining the expected rate of change of SOC for each time period. In some examples, probabilities associated with each activity can be provided and can be used as weighting factors for rates of discharge associated with the respective activities. For example, for the time period $T_{tn \to tn+1}$ between the first time $t_n$ and the second time $t_{n+1}$, it can be determined that the expected activities include $A_1, A_3$ and $A_4$. In some examples, the rate of discharge of the battery between the first time $t_n$ and the second time $t_{n+1}$ can be provided as a function of the base rate of discharge $(dSOC/dt)_{BASE}$; the multipliers $\alpha_1, \alpha_3,$ and $\alpha_4$; and the probabilities $P_{A1}, P_{A3}$ and $P_{A4}$. The following example relationship can be provided:

$$(dSOC/dt)_{m \to m+1} = f(dSOC/dt_{BASE}, \alpha_1, \alpha_3, \alpha_4, P_{A1}, P_{A3}, P_{A4}).$$

In a particular example, the rate of discharge of the battery between the first time $t_n$ and the second time $t_{n+1}$ can be provided as a sum of the rates of discharge of determined based on each of the expected activities between the first time $t_n$ and the second time $t_{n+1}$. For example, the rate of discharge of the battery between the first time $t_n$ and the second time $t_{n+1}$ can be provided as a sum of the rates of discharge associated with the activities $A_1, A_3$ and $A_4$, and can be represented by the following example relationship:

$$(dSOC/dt)_{m \to m+1} = (dSOC/dt)_{A1} + (dSOC/dt)_{A3} + (dSOC/dt)_{A4};$$

and more specifically:

$$(dSOC/dt)_{m \to m+1} = [P_{A1} \times \alpha_1 \times (dSOC/dt)_{BASE}] + [P_{A3} \times \alpha_3 \times (dSOC/dt)_{BASE}] + [P_{A4} \times \alpha_4 \times (dSOC/dt)_{BASE}];$$

and simplified:

$$(dSOC/dt)_{m \to m+1} = [(P_{A1})(\alpha_1) + (P_{A3})(\alpha_3) + (P_{A4})(\alpha_4)] \times [(dSOC/dt)_{BASE}].$$

Figure 3:
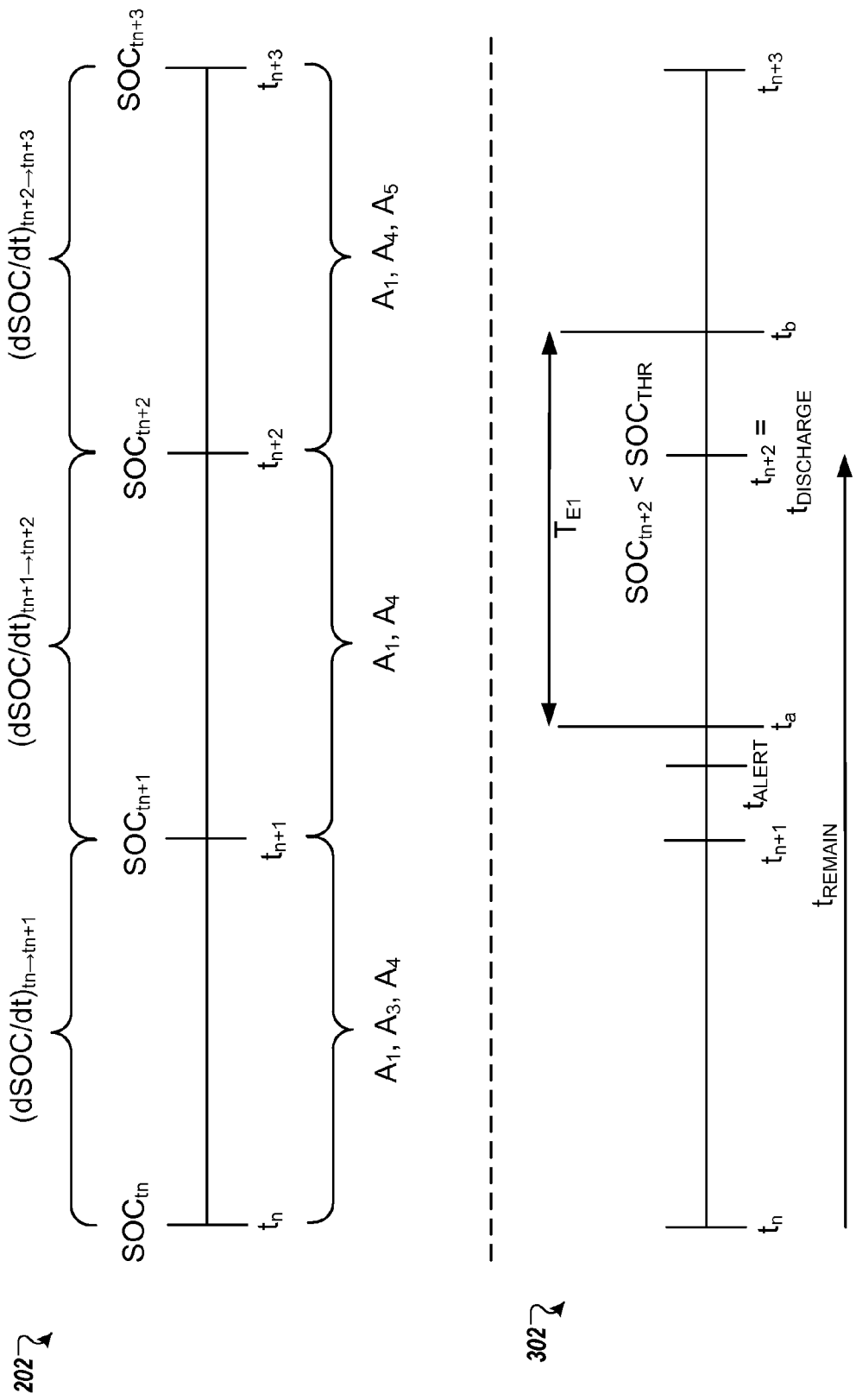
FIG. 3 depicts the example timeline of FIG. 2 relative to an example event timeline.

FIG. 3 depicts the example timeline 202 of FIG. 2 relative to an example event timeline 302. Specifically, events $E_1, E_2, \ldots, E_m$ that are associated with the user or with the mobile computing device. For example, the events can include calendar-based events (e.g., an upcoming appointment such as a flight, a scheduled conference call), reminder based events, geo-location events (e.g., location of a user) or other appropriate events. Each of the events can be associated with a time period $T_{EM}$ that the event is expected to last for (e.g., event duration). For ease of understanding, the timeline 302 is shown adjacent to the timeline 202.

In some implementations, one or more notifications can be generated based on the estimated SOCs (e.g., as depicted in the timeline 202) and the identified events (e.g., as depicted in the timeline 302). In some examples, and as discussed above, a time at which the predicted SOC falls below the threshold SOC ($t_{DISCHARGE}$) can be determined. In some examples, it can be determined that tDISCHARGE occurs during a time period ($T_{Em}$) of an event ($E_m$). Consequently, and prior to the occurrence of the event, a notification can be issued to recommend that the mobile computing device be charged. In some examples, the $t_{DISCHARGE}$ is compared with one or more time periods $T_{Em}$ of the events $E_1, E_2, \ldots, E_m$ to determine whether the time $t_{DISCHARGE}$ occurs during one or more of the time periods $T_{Em}$. In some examples, event time periods can overlap. If $t_{DISCHARGE}$ occurs during any of the time periods $T_{Em}$, a notification is generated and provided to the user (e.g., displayed).

For example, as shown in FIG. 3, it is determined that the SOC of the battery at a third time $t_{n+2}(SOC_{tn+2})$ is less than the threshold SOC ($SOC_{THR}$). Thus, the time $t_{DISCHARGE}$ is identified at the third time $t_{n+2}$. Further, an event $E_1$ (e.g., airline flight) is identified that is associated with a time period $T_{E1}$ that occurs between a time $t_a$ and a time $t_b$. The time $t_{DISCHARGE}$ is compared to the time period $T_{E1}$, and it is determined that the $t_{DISCHARGE}$ is estimated to occur during the time period $T_{E1}$. In some examples, tREMAIN can be determined as a difference between the current time (e.g., $t_n$) and the predicted $t_{DISCHARGE}$. In some examples, a notification can be generated in response to determining that $t_{DISCHARGE}$ is estimated to occur during the time period $T_{E1}$.

Figure 4:
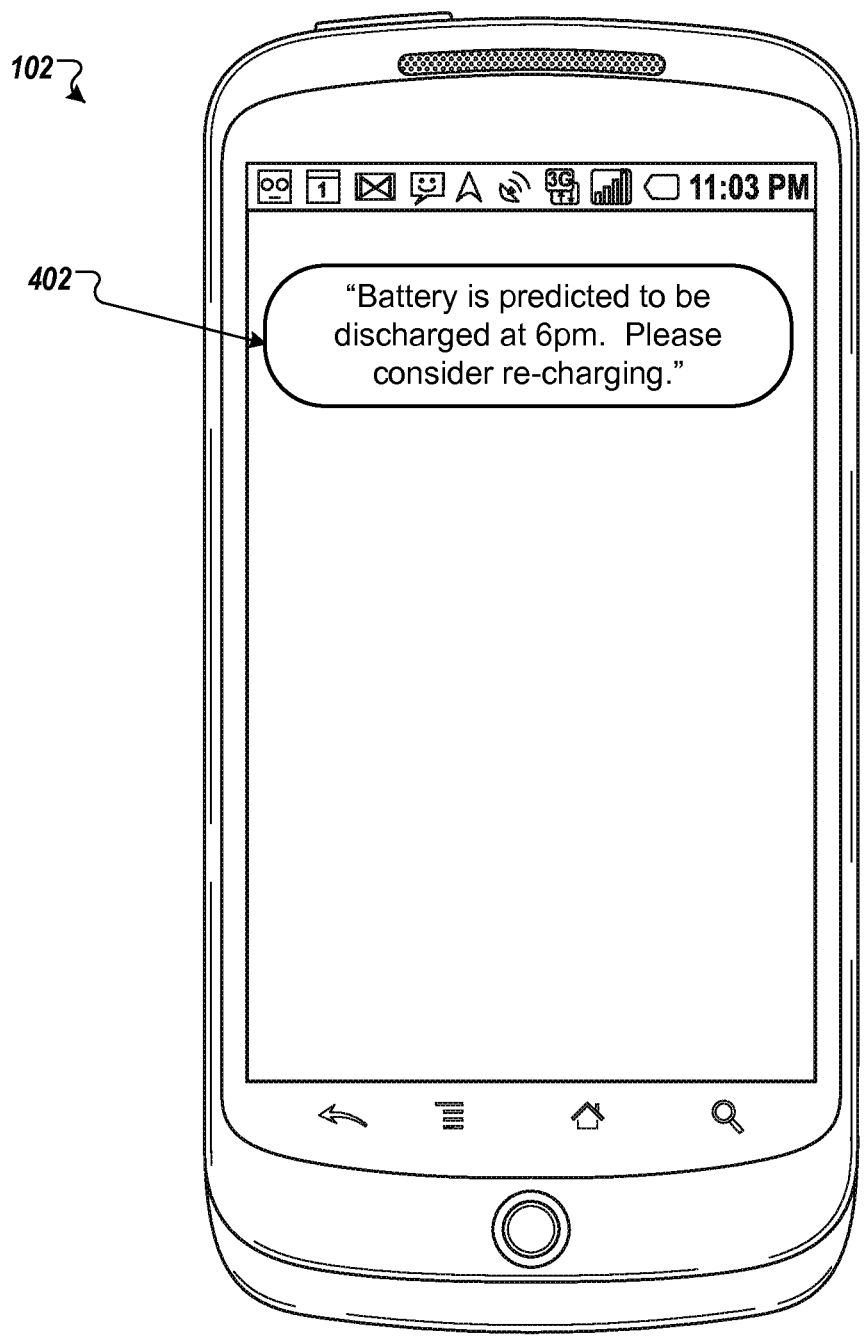
FIG. 4 depicts a mobile computing device displaying an example notification.

FIG. 4 depicts a mobile computing device 102 displaying an example notification 402. For example, the notification can be generated and displayed based on identifying that $t_{DISCHARGE}$ is expected to occur during an event. In some examples, the notification 402 can be provided to notify the user that the battery should be charged. In some examples, the notification 402 can be provided to the user at a time $t_{ALERT}$. In some examples, $t_{ALERT}$ occurs before the event is expected to occur. In some examples, $t_{ALERT}$ is occurs at tn (e.g., at the current time, when it is determined that $t_{DISCHARGE}$ is expected to occur during an event). In some examples, $t_{ALERT}$ is provided at some time between tn and ta (as depicted in FIG. 3).

In the depicted example, the notification 402 includes such information as the time $t_{DISCHARGE}$ when the SOC is expected to be below the threshold SOC. In some examples, notifications can include concurrently occurring events during which the SOC is expected to be below the threshold SOC; suggestions to charge the mobile computing device; and/or suggestions to decrease expected activity of the mobile computing device. In some examples, the mobile computing device can proactively turn off certain processing modules to conserve battery power (e.g., turn off Bluetooth), or prevent certain activities (e.g., roaming) of the mobile computing device to conserve battery power.

Figure 5:
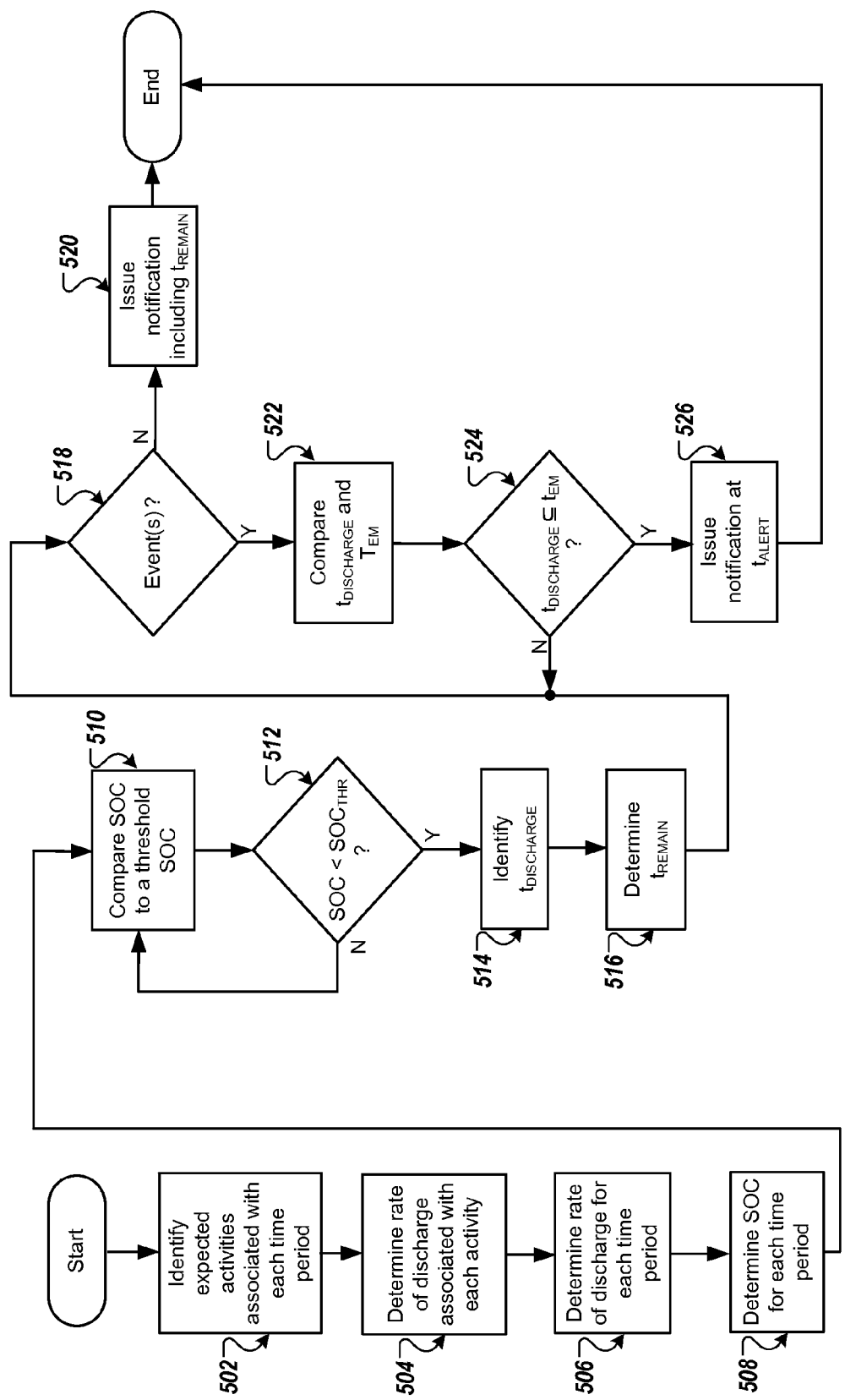
FIG. 5 depicts an example process that can be executed in accordance with implementations of the present disclosure.

FIG. 5 depicts an example process 500 that can be executed in accordance with implementations of the present disclosure. The example process 500 can be provided as one or more computer-executable programs executed using one or more computing devices. For example, one or more server systems (e.g., the server 110), and/or a mobile computing device (e.g., the mobile computing device 102) can be used to execute the example process 500.

Expected activities that are associated with each time period are identified (502). Specifically, one or more activities $A_1, A_2, \ldots, A_p$ are identified that are associated with one or more time periods T. For example, and with reference to FIG. 2, activities $A_1$ $A_3$ and $A_4$ are identified and are associated with the time period $T_{tn \to tn+1}$ between the first time $t_n$ and the second, later time $t_{n+1}$.

A rate of discharge associated with each activity is determined (504). In some examples, the rate of discharge associated with each activity is a function of a base rate of discharge and a respective multiplier associated with the activity. For example, a rate of discharge associated with an activity of a time period is the product of the multiplier associated with the activity and the base rate of discharge. In some examples, the multiplier associated with the activity is dependent (based on) on the time period. In some examples, a probability associated with an activity is used in determining the rate of discharge associated with the activity, as discussed herein.

An expected rate of discharge for each time period is determined (506). In some examples, the expected rate of discharge for each time period is determined as a function of the base rate of discharge, and the multipliers associated with the expected activities of the time period. In some examples, probabilities associated with the respective activities are considered. In some examples, the rate of discharge of a time period is provided as a sum of the rates of discharge associated with respective activities of the time period.

A SOC is determined for each time period (508). Specifically, the SOC for each time period is a function of the expected rate of discharge for the time period, the actual or expected SOC at the beginning of the time period, and the duration of the time period. For example, the SOC for a time period can be provided as a difference between the SOC at the beginning of the time period and the amount of SOC that is expected to be depleted during the time period. The amount of SOC that is expected to be depleted during the time period can be provided as a function of the expected rate of discharge and the duration of the time period.

The SOC for each time period is compared to a threshold SOC (510). In some examples, the SOC can include an expected SOC at an end of a time period and a beginning of a next time period.

It is determined whether the SOC for a time period is less than the SOC threshold (512). Specifically, for each time period, it is determined whether the SOC of the time period is less than the threshold SOC. If it is determined that the SOC of a time period is not less than the SOC threshold (in other words, the SOC of the time period is greater than the SOC threshold), the SOC of the next time period (e.g., the following time period) is compared to the threshold SOC (510).

If it is determined that the SOC of a time period is less than the SOC threshold, the time of discharge ($t_{DISCHARGE}$) is determined (514). In some examples, $t_{DISCHARGE}$ is the time at which the predicted SOC falls below the threshold SOC. In some examples, $t_{DISCHARGE}$ can be equal to the end time of the time period (e.g., $t_{n+2}$). In some examples, $t_{DISCHARGE}$ can be determined as a time between the begin time (e.g., $t_{n+1}$) and the end time (e.g., $t_{n+2}$) of the time period. The time remaining $t_{REMAIN}$ of the battery is determined (516). In some examples, $t_{REMAIN}$ is determined as a difference between a current time (e.g., $t_n$) and $t_{DISCHARGE}$.

It is determined whether any events are expected (518). In response to determining that no events are expected, $t_{REMAIN}$ is provided (e.g., displayed) to the user (520). In response to determining that at least one event is expected, $t_{DISCHARGE}$ is compared with one or more event time periods $T_{Em}$, each time period being associated with an event (522). It is determined whether $t_{DISCHARGE}$ is expected to occur during $T_{Em}$ (524). In response to determining that $t_{DISCHARGE}$ is not expected to occur during $T_{Em}$, $t_{REMAIN}$ is provided (e.g., displayed) to the user (520). In response to determining that $t_{DISCHARGE}$ is expected to occur during $T_{Em}$, a notification is issued at a time $t_{ALERT}$ (526) and $t_{REMAIN}$ is provided (e.g., displayed) to the user (520).

Implementations of the present disclosure and all of the functional operations provided herein can be realized in digital electronic circuitry, or in computer software, firmware, or hardware, including the structures disclosed in this specification and their structural equivalents, or in combinations of one or more of them. Implementations of the present disclosure can be realized as one or more computer program products, i.e., one or more modules of computer program instructions encoded on a computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more of them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a stand alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this disclose can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. Elements of a computer can include a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a mobile telephone, a personal digital assistant (PDA), a mobile audio player, a Global Positioning System (GPS) receiver, to name just a few. Computer readable media suitable for storing computer program instructions and data include all forms of non volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

To provide for interaction with a user, implementations of the present disclosure can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

While this disclosure includes some specifics, these should not be construed as limitations on the scope of the disclosure or of what may be claimed, but rather as descriptions of features of example implementations of the disclosure. Certain features that are described in this disclosure in the context of separate implementations can also be provided in combination in a single implementation. Conversely, various features that are described in the context of a single implementation can also be provided in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

Thus, particular implementations of the present disclosure have been described. Other implementations are within the scope of the following claims. For example, the actions recited in the claims can be performed in a different order and still achieve desirable results. A number of implementations have been described. Nevertheless, it will be understood that various modifications may be made without departing from the spirit and scope of the disclosure. For example, various forms of the flows shown above may be used, with steps re-ordered, added, or removed. Accordingly, other implementations are within the scope of the following claims.

What is claimed is:

1. A computer-implemented method executed using one or more processors, the method comprising:
    identifying a set of expected activities, each expected activity in the set of expected activities comprising an activity that is expected to be performed by a mobile computing device at a future time, the set of expected activities comprising activities identified based on a historical usage of activities that have been previously performed by the mobile computing device;
    determining, by the one or more processors, for each expected activity of the set of expected activities, an expected time when the expected activity is expected to be performed, the expected activities performed over one or more future time periods;
    determining, by the one or more processors, one or more expected rates of change of a state of charge (SOC) of a battery of the mobile computing device by, for each future time period of the one or more future time periods, determining an expected rate of change of the SOC based on a base rate of discharge of the SOC and one or more expected rates of discharge associated with, respectively, one or more expected activities of the set of expected activities that are associated with the future time period; and
    determining, by the one or more processors, an estimated remaining time based on the one or more expected rates of change of the SOC, the estimated remaining time corresponding to a future time at which an expected SOC is less than a threshold SOC.

2. The method of claim 1, further comprising providing a notification based on the estimated remaining time.

3. The method of claim 2, wherein the notification notifies a user of the mobile computing device that the battery of the mobile computing device should be charged.

4. The method of claim 2, further comprising:
    identifying one or more expected events;
    for each expected event, determining an event time period, the event time period indicating an expected duration of a respective expected event; and
    determining that the time at which the expected SOC is less than the threshold SOC occurs during one or more event time periods, wherein providing the notification occurs in response to determining that the time at which the expected SOC is less than the threshold SOC occurs during one or more event time periods.

5. The method of claim 1, wherein each of the expected activities is identified based on one or more of a usage pattern associated with a user of the mobile computing device and a calendar of the user.

6. The method of claim 1, wherein each expected activity of the one or more expected activities is associated with a respective multiplier, and the expected rate of discharge associated with a particular expected activity is determined based on the multiplier associated with the particular expected activity and the base rate of change of the SOC.

7. The method of claim 1, wherein each expected activity in the set of expected activities is associated with a respective probability.

8. The method of claim 7, wherein the one or more expected rates of change of the SOC are determined based on the probabilities.

9. The method of claim 7, wherein each respective probability exceeds a threshold probability.

10. The method of claim 1, further comprising determining a current SOC of the battery of the mobile computing device, wherein determining the one or more expected rates of change of the SOC is based on the current SOC.

11. A non-transitory computer-readable medium coupled to one or more processors having instructions stored thereon which, when executed by the one or more processors, cause the one or more processors to perform operations comprising:
    identifying a set of expected activities, each expected activity in the set of expected activities comprising an activity that is expected to be performed by a mobile computing device at a future time, the set of expected activities comprising activities identified based on a historical usage of activities that have been previously performed by the mobile computing device;

determining, by the one or more processors, for each expected activity of the set of expected activities, an expected time when the expected activity is expected to be performed, the expected activities performed over one or more future time periods;

determining, by the one or more processors, one or more expected rates of change of a state of charge (SOC) of a battery of the mobile computing device by, for each future time period of the one or more future time periods, determining an expected rate of change of the SOC based on a base rate of discharge of the SOC and one or more expected rates of discharge associated with, respectively, one or more expected activities of the set of expected activities that are associated with the future time period; and determining, by the one or more processors, an estimated remaining time based on the one or more expected rates of change of the SOC, the estimated remaining time corresponding to a future time at which an expected SOC is less than a threshold SOC.

12. The computer-readable medium of claim 11, the operations further comprising providing a notification based on the estimated remaining time.

13. The computer-readable medium of claim 12, wherein the notification notifies a user of the mobile computing device that the battery of the mobile computing device should be charged.

14. The computer-readable medium of claim 12, the operations further comprising:
identifying one or more expected events;
for each expected event, determining an event time period, the event time period indicating an expected duration of a respective expected event; and
determining that the time at which the expected SOC is less than the threshold SOC occurs during one or more event time periods, wherein providing the notification occurs in response to determining that the time at which the expected SOC is less than the threshold SOC occurs during one or more event time periods.

15. The computer-readable medium of claim 11, wherein each of the expected activities is identified based on one or more of a usage pattern associated with a user of the mobile computing device and a calendar of the user.

16. The computer-readable medium of claim 11, wherein each expected activity of the one or more expected activities is associated with a respective multiplier, and the expected rate of discharge associated with a particular expected activity is determined based on the multiplier associated with the particular expected activity and the base rate of change of the SOC.

17. The computer-readable medium of claim 11, wherein each expected activity in the set of expected activities is associated with a respective probability.

18. The computer-readable medium of claim 17, wherein the one or more expected rates of change of the SOC are determined based on the probabilities.

19. The computer-readable medium of claim 17, wherein each respective probability exceeds a threshold probability.

20. The computer-readable medium of claim 11, the operations further comprising determining a current SOC of the battery of the mobile computing device, wherein determining the one or more expected rates of change of the SOC is based on the current SOC.

21. A mobile computing device, comprising:
a display;
one or more processors in communication with the display; and
a computer-readable medium that is coupled to the one or more processors and that has instructions stored thereon which, when executed by the one or more processors, cause the one or more processors to perform operations comprising:
identifying a set of expected activities, each expected activity in the set of expected activities comprising an activity that is expected to be performed by a mobile computing device at a future time, the set of expected activities comprising activities identified based on a historical usage of activities that have been previously performed by the mobile computing device;
determining, by the one or more processors, for each expected activity of the set of expected activities, an expected time when the expected activity is expected to be performed, the expected activities performed over one or more future time periods;
determining, by the one or more processors, one or more expected rates of change of a state of charge (SOC) of a battery of the mobile computing device by, for each future time period of the one or more future time periods, determining an expected rate of change of the SOC based on a base rate of discharge of the SOC and one or more expected rates of discharge associated with, respectively, one or more expected activities of the set of expected activities that are associated with the future time period; and
determining, by the one or more processors, an estimated remaining time based on the one or more expected rates of change of the SOC, the estimated remaining time corresponding to a future time at which an expected SOC is less than a threshold SOC.

22. The mobile computing device of claim 21, the operations further comprising providing a notification based on the estimated remaining time.

23. The mobile computing device of claim 22, wherein the notification notifies a user of the mobile computing device that the battery of the mobile computing device should be charged.

24. The mobile computing device of claim 22, the operations further comprising:
identifying one or more expected events;
for each expected event, determining an event time period, the event time period indicating an expected duration of a respective expected event; and
determining that the time at which the expected SOC is less than the threshold SOC occurs during one or more event time periods, wherein providing the notification occurs in response to determining that the time at which the expected SOC is less than the threshold SOC occurs during one or more event time periods.

25. The mobile computing device of claim 21, wherein each of the expected activities is identified based on one or more of a usage pattern associated with a user of the mobile computing device and a calendar of the user.

26. The mobile computing device of claim 21, wherein each expected activity of the one or more expected activities is associated with a respective multiplier, and the expected rate of discharge associated with a particular expected activity is determined based on the multiplier associated with the particular expected activity and the base rate of change of the SOC.

27. The mobile computing device of claim 21, wherein each expected activity in the set of expected activities is associated with a respective probability.

28. The mobile computing device of claim 27, wherein the one or more expected rates of change of the SOC are determined based on the probabilities.

29. The mobile computing device of claim 27, wherein each respective probability exceeds a threshold probability.

30. The mobile computing device of claim 21, the operations further comprising determining a current SOC of the battery of the mobile computing device, wherein determining the one or more expected rates of change of the SOC is based on the current SOC.

* * * * *